US010833386B2

(12) United States Patent
Kitt

(10) Patent No.: US 10,833,386 B2
(45) Date of Patent: Nov. 10, 2020

(54) WAVEGUIDE TRANSITIONS FOR POWER-COMBINING DEVICES

(71) Applicant: Qorvo US, Inc., Greensboro, NC (US)

(72) Inventor: John Kitt, Ventura, CA (US)

(73) Assignee: Qorvo US, Inc., Greensboro, NC (US)

( * ) Notice: Subject to any disclaimer, the term of this patent is extended or adjusted under 35 U.S.C. 154(b) by 1 day.

(21) Appl. No.: 16/039,435

(22) Filed: Jul. 19, 2018

(65) Prior Publication Data

US 2019/0312327 A1  Oct. 10, 2019

Related U.S. Application Data

(60) Provisional application No. 62/654,890, filed on Apr. 9, 2018.

(51) Int. Cl.
*H01P 5/08* (2006.01)
*H01P 3/06* (2006.01)
(Continued)

(52) U.S. Cl.
CPC ............... *H01P 5/08* (2013.01); *H01P 3/06* (2013.01); *H01P 3/127* (2013.01); *H01P 5/024* (2013.01);
(Continued)

(58) Field of Classification Search
CPC .. H01P 5/08; H01P 3/127; H01P 5/024; H01P 3/06; H01P 5/103; H01P 5/12;
(Continued)

(56) References Cited

U.S. PATENT DOCUMENTS 3,023,382 A * 2/1962 Borghetti ............... H01P 5/103
333/34
4,234,854 A 11/1980 Schellenberg et al.
(Continued)

FOREIGN PATENT DOCUMENTS

WO    2017214357 A2    12/2017

OTHER PUBLICATIONS

Non-Final Office Action for U.S. Appl. No. 15/933,821, dated Jul. 11, 2019, 7 pages.
(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Waveguide transition devices for power-combining devices are disclosed. A waveguide transition device includes a coaxial waveguide section that is configured to concurrently receive electromagnetic output signals from a plurality of amplifiers and transition the electromagnetic output signals to a waveguide coupling section to form a combined and amplified electromagnetic signal. In turn, the waveguide coupling section transitions the combined and amplified electromagnetic signal to a waveguide output port. As disclosed herein, representative waveguide transition devices are configured to allow higher operating powers without typical device failure mechanisms. Spatial power-combining devices that include representative waveguide transition devices have improved power handling capabilities.

20 Claims, 7 Drawing Sheets

(51) Int. Cl.
  *H01P 5/02* (2006.01)
  *H01Q 25/00* (2006.01)
  *H03F 3/19* (2006.01)
  *H03F 3/21* (2006.01)
  *H01P 3/127* (2006.01)

(52) U.S. Cl.
  CPC ............... *H01Q 25/00* (2013.01); *H03F 3/19* (2013.01); *H03F 3/21* (2013.01); *H03F 2200/451* (2013.01)

(58) Field of Classification Search
  CPC ........ H03F 3/21; H03F 3/19; H03F 2200/451; H01Q 25/00
  USPC ........................................................ 333/125
  See application file for complete search history.

(56) References Cited

U.S. PATENT DOCUMENTS

| | | | |
|---|---|---|---|
| 4,424,496 | A | 1/1984 | Nichols et al. |
| 5,036,335 | A | 7/1991 | Jairam |
| 5,162,803 | A | 11/1992 | Chen |
| 5,214,394 | A | 5/1993 | Wong |
| 5,256,988 | A | 10/1993 | Izadian |
| 5,736,908 | A | 4/1998 | Alexanian et al. |
| 5,920,240 | A | 7/1999 | Alexanian et al. |
| 5,928,429 | A | 7/1999 | Duncan et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 | 12/2008 | Rector |
| 8,698,577 | B2 | 4/2014 | Sherrer et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,325,074 | B2 | 4/2016 | Chandler |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2014/0145794 | A1 | 5/2014 | Courtney et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |

OTHER PUBLICATIONS

Non-Final Office Action for U.S. Appl. No. 15/981,516, dated Jul. 17, 2019, 5 pages.
Author Unknown, "Interpack 2005: An assessment for PMMI members," 2005, PMMI, 32 pages.
Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.
Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.
Larkins, Grover, et al., "Evidence of Superconductivity in Doped Graphite and Graphene," Superconductor Science and Technology, vol. 29, Issue 1, Dec. 2015, IOP Publishing Ltd, 18 pages.
Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.
Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/637,472, dated Aug. 10, 2018, 8 pages.
Notice of Allowance for U.S. Appl. No. 15/927,565, dated Aug. 8, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.
Courtney, Patrick G. et al., "120 W Ka Band Power Amplifier Utilizing GaN MMICs and Coaxial Waveguide Spatial Power Combining," White Paper, May 2016, Qorvo, pp. 1-8.
Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.
Leggieri, Alberto et al., "The Squarax Spatial Power Combiner," Progress in Electromagnetics Research C, vol. 45, Oct. 2013, EMW Publishing, pp. 43-55.
Ortiz, Sean C., "High Power Spatial Combiners: Tile and Tray Approaches," Dissertation, North Carolina State University, Electrical Engineering, Nov. 2001, 194 pages.
Notice of Allowance for U.S. Appl. No. 15/290,749, dated Feb. 16, 2018, 9 pages.
Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.
Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.
Fathy, A., et al., "A Simplified Approach for Radial Power Combiners," IEEE Transactions on Microwave Theory and Techniques, vol. 54, No. 1, Jan. 2006, pp. 247-255.
Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

(56) References Cited

OTHER PUBLICATIONS

Tribak, A., et al., "Ultra-Broadband High Efficiency Mode Converter," Progress in Electromagnetics Research C, vol. 36, 2013, pp. 145-158.
Montgomery, R., et al., "Solid-State PAs Bathe TWTAs for ECM Systems," Microwave Journal, Jun. 2017 Supplement, Jun. 14, 2017, 3 pages.
Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.
Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.
Corrected Notice of Allowance and Examiner-Initiated Interview Summary for U.S. Appl. No. 15/846,840, dated Dec. 12, 2019, 6 pages.
Notice of Allowance for U.S. Appl. No. 16/005,794, dated Jan. 9, 2020, 7 pages.
Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Notice of Allowance for U.S. Appl. No. 15/981,516, dated Jan. 15, 2020, 7 pages.
Corrected Notice of Allowability and Examiner-Initiated Interview Summary for U.S. Appl. No. 16/005,794, dated May 26, 2020, 6 pages.
Notice of Allowance for U.S. Appl. No. 16/032,252, dated Jun. 1, 2020, 7 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Final Office Action for U.S. Appl. No. 16/191,541, dated Mar. 31, 2020, 8 pages.
Advisory Action, Examiner-Initiated Interview Summary, and AFCP 2.0 Decision for U.S. Appl. No. 16/191,541, dated May 21, 2020, 5 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.

* cited by examiner

WAVEGUIDE TRANSITIONS FOR POWER-COMBINING DEVICES

RELATED APPLICATIONS

This application claims the benefit of provisional patent application Ser. No. 62/654,890, filed Apr. 9, 2018, the disclosure of which is hereby incorporated herein by reference in its entirety.

FIELD OF THE DISCLOSURE

The disclosure relates generally to power-combining devices and, more particularly, to waveguide transitions for power-combining devices.

BACKGROUND

Power-combining devices typically utilize power-combining schemes to combine outputs from multiple amplifiers into a single amplified output signal. One such device is a solid state power amplifier that splits an electromagnetic signal across multiple amplifiers for amplification before subsequently combining the outputs from the multiple amplifiers. Solid state power amplifiers generate low noise with improved linearity, and provide good reliability while achieving high output powers, bandwidths, and efficiencies needed for various applications. A solid state power amplifier is able to provide these operating characteristics while at the same time providing a device with a smaller overall size and weight.

Spatial power-combining devices, such as a Qorvo® Spatium® spatial power-combining device, are types of solid state power amplifiers used for broadband radio frequency power amplification in commercial and defense communications; including radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

The art continues to seek improved power-combining devices that provide improved combinations of output power, bandwidth, and efficiency and are capable of overcoming challenges associated with conventional devices.

SUMMARY

Aspects disclosed herein relate to power-combining devices, and in particular, to waveguide transition devices for use in power-combining devices. A waveguide transition device includes a coaxial waveguide section that is configured to concurrently receive electromagnetic output signals from a plurality of amplifiers and transition the electromagnetic output signals to a waveguide coupling section to form a combined and amplified electromagnetic signal. In turn, the waveguide coupling section transitions the combined electromagnetic signal to a waveguide output port. As disclosed herein, representative waveguide transition devices are configured to allow higher operating powers without typical device failure mechanisms. Spatial power-combining devices that include representative waveguide transition devices have improved power handling capabilities.

In some aspects, a waveguide transition device includes a coaxial waveguide section comprising an inner conductor and an outer conductor; a waveguide output port; and a waveguide coupling section between the coaxial waveguide section and the waveguide output port; wherein the outer conductor, the waveguide coupling section, and the waveguide output port are an integral single component. In some embodiments, the inner conductor and the outer conductor are radially separated by a cone-shaped hollow opening. In some embodiments, the waveguide coupling section comprises a cylindrical hollow opening that is coupled to the cone-shaped hollow opening. In some embodiments, the waveguide coupling section is devoid of an inner conductor. The waveguide transition device may further include a septum between the waveguide coupling section and the waveguide output port. The septum may form at least two hollow channels that connect between the waveguide coupling section and the waveguide output port. In some embodiments, the waveguide output port comprises a rectangular waveguide. Spatial-power combining devices and radial power-combining devices may include the waveguide transition devices as disclosed herein.

In some aspects, a waveguide transition device includes a coaxial waveguide section comprising an inner conductor and an outer conductor that are radially separated by a first hollow opening; a waveguide coupling section comprising a second hollow opening that is registered with the first hollow opening and the inner conductor; and a waveguide output port coupled to the waveguide coupling section. In some embodiments, the first hollow opening includes a cone-shaped opening. In some embodiments, the second hollow opening comprises a cylindrical opening. The waveguide transition device may further include a septum between the waveguide coupling section and the waveguide output port. The septum may form at least two hollow channels that connect between the waveguide coupling section and the waveguide output port. In some embodiments, the waveguide output port comprises a rectangular waveguide.

In some aspects, a spatial power-combining device comprises a plurality of amplifier assemblies, wherein each amplifier assembly of the plurality of amplifier assemblies comprises: an amplifier; an input antenna structure; and an output antenna structure; an output coaxial waveguide section comprising an output inner conductor and an output outer conductor; a waveguide output port; and a waveguide coupling section between the output coaxial waveguide section and the waveguide output port; wherein the output outer conductor, the waveguide coupling section, and the waveguide output port are an integral single component. In some embodiments, the output coaxial waveguide section comprises an output coaxial opening and the waveguide coupling section comprises a cylindrical waveguide opening. In some embodiments, the cylindrical waveguide opening is registered with the output coaxial opening and the output inner conductor. The waveguide output port may include a rectangular waveguide opening that is connected to the cylindrical waveguide opening. In some embodiments, the plurality of amplifier assemblies are radially arranged around a center rod and the output inner conductor is mechanically attached to the center rod. In other embodiments, the output inner conductor is mechanically attached to the plurality of amplifier assemblies.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
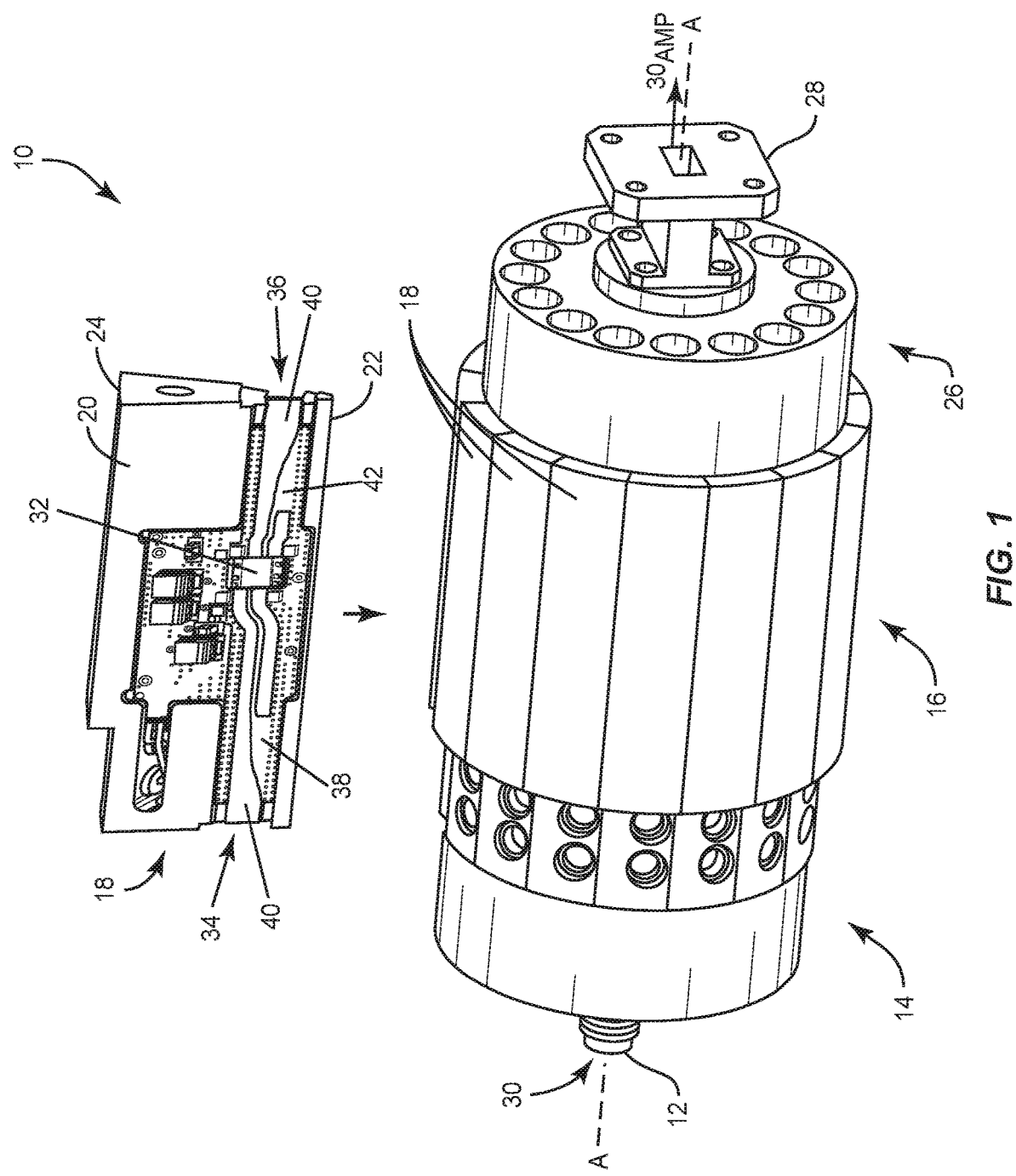
FIG. 1 is a partially-exploded perspective view of a spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to power-combining devices, and in particular, to waveguide transition devices for use in power-combining devices. A waveguide transition device includes a coaxial waveguide section that is configured to concurrently receive electromagnetic output signals from a plurality of amplifiers and transition the electromagnetic output signals to a waveguide coupling section to form a combined and amplified electromagnetic signal. In turn, the waveguide coupling section transitions the combined electromagnetic signal to a waveguide output port. As disclosed herein, representative waveguide transition devices are configured to allow higher operating powers without typical device failure mechanisms. Spatial power-combining devices that include representative waveguide transition devices have improved power handling capabilities.

The embodiments are particularly adapted to spatial power-combining devices that operate at microwave frequencies such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of 30 GHz to 40 GHz. In other embodiments, the operating frequency range includes a frequency of at least 18 GHz.

A spatial power-combining device generally includes a plurality of amplifier assemblies, and each amplifier assembly includes an amplifier sub-assembly. The amplifier sub-assembly includes an amplifier connected to an input antenna structure and an output antenna structure to provide an individual signal path. An input coaxial waveguide section is configured to provide a signal concurrently to each input antenna structure, and an output coaxial waveguide section is configured to concurrently combine amplified signals from each output antenna structure. The plurality of amplifier assemblies are arranged coaxially about a center axis. Accordingly, the spatial power-combining device is configured to split, amplify, and combine an electromagnetic signal.

FIG. 1 is a partially-exploded perspective view of a spatial power-combining device 10. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16.

The center waveguide section 16 comprises a plurality of amplifier assemblies 18 arranged radially around a center axis A of the spatial power-combining device 10. Each amplifier assembly 18 comprises a body 20 having a predetermined wedge-shaped cross-section, an inner surface 22, and an arcuate outer surface 24. When the amplifier assemblies 18 are collectively assembled radially about the center axis A, they form the center waveguide section 16 with a generally cylindrical shape; however, other shapes are possible, such as rectangular, oval, or other geometric shapes.

The spatial power-combining device 10 also comprises an output coaxial waveguide section 26 and an output port 28. The input port 12 and the output port 28 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 GHz, the output port 28 may comprise a waveguide output port, such as a WR28 or other sized waveguide. The output coaxial waveguide section 26 provides a broadband transition from the center waveguide section 16 to the output port 28. Electrically, the output coaxial waveguide section 26 provides broadband impedance matching from the impedance $Z_c$ of the center waveguide section 16 to an impedance $Z_{p2}$ of the output port 28. The input port 12 is configured to receive an input signal 30 and the output port 28 is configured to output an amplified signal $30_{AMP}$.

The input coaxial waveguide section 14 is configured to receive the input signal 30 from the input port 12 and concurrently provide the input signal 30 to each amplifier assembly 18 of the plurality of amplifier assemblies 18. The output coaxial waveguide section 26 is configured to concurrently combine amplified signals transmitted from each amplifier assembly 18 of the plurality of amplifier assemblies 18 to output the amplified signal $30_{AMP}$ through the output port 28.

Each amplifier assembly 18 comprises an amplifier 32, an input antenna structure 34 coupled to the amplifier 32, and an output antenna structure 36 coupled to the amplifier 32. In some embodiments, the amplifier 32 comprises a monolithic microwave integrated circuit (MMIC) amplifier. A MMIC may be a solid-state gallium nitride (GaN) based MMIC. A GaN MMIC device provides high power density and bandwidth, and a spatial power-combining device may combine power from a plurality of GaN MMICs efficiently in a single step to minimize combining loss.

The input antenna structure 34 comprises an input signal conductor 38 supported on a board 40, and the output antenna structure 36 comprises an output signal conductor 42 that is also supported on the board 40. The input signal conductor 38 and the output signal conductor 42 are electromagnetically coupled to the amplifier 32. The board 40 may be a printed circuit board that provides a desired form factor and mechanical support for the input signal conductor 38 and the output signal conductor 42. The input antenna structure 34 also includes an input ground conductor (not visible) on an opposing side of the board 40 to the input signal conductor 38. In a similar manner, the output antenna structure 36 includes an output ground conductor (not visible) on an opposing side of the board 40 to the output signal conductor 42. In other embodiments, the board 42 may be substituted with a plurality of boards. In still other embodiments, the input signal conductor 38 and the input ground conductor (not visible) are mechanically supported by the body 20 such that the board 40 may not be present.

In operation, a portion of the input signal 30 is received by the input antenna structure 34 of each amplifier assembly 18. The portion of the input signal 30 radiates between the input signal conductor 38 and the input ground conductor (not visible) and propagates to the amplifier 32 for amplification. For embodiments with a board 40, the portion of the input signal 30 radiates between the input signal conductor 38 and the input ground conductor (not visible) through the board 40. For embodiments without a board 40, the portion of the input signal 30 radiates between the input signal conductor 38 and the input ground conductor (not visible) through air. The amplifier 32 outputs a portion of the amplified signal $30_{AMP}$ to the output antenna structure 36 where it radiates between the output signal conductor 42 and the output ground conductor (not visible) in a similar manner and propagates to the output coaxial waveguide section 26. The combined and amplified signal $30_{AMP}$ is then propagated through the output port 28. In this manner, the output coaxial waveguide section 26 and the output port 28 experience higher operating powers than the input port 12 and the input coaxial waveguide section 14.

Figure 2:
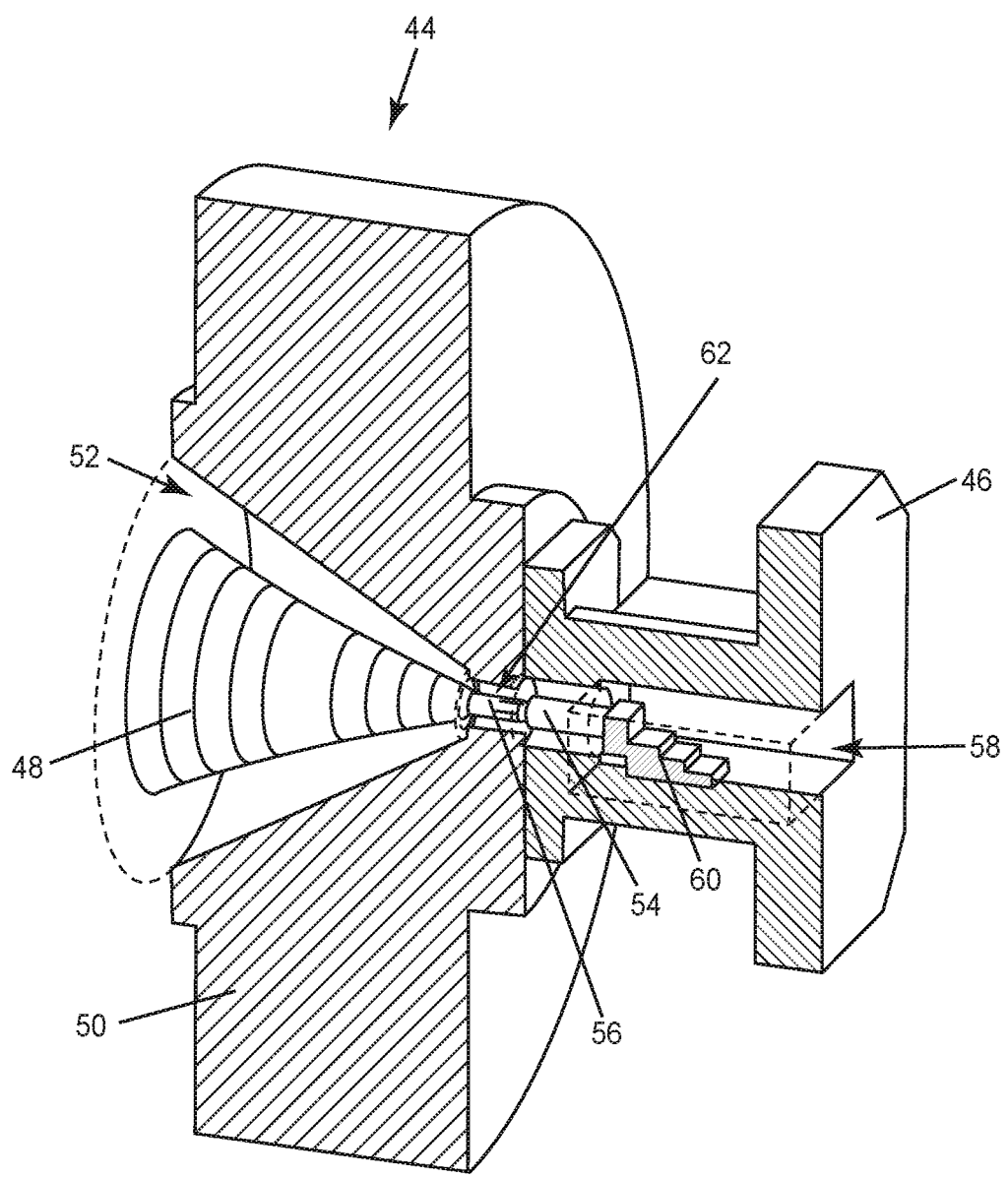
FIG. 2 is a cross-sectional view of an output coaxial waveguide section and an output port that are similar to the output coaxial waveguide section and the output port of FIG. 1.

FIG. 2 is a cross-sectional view of an output coaxial waveguide section 44 and an output port 46 that are similar to the output coaxial waveguide section 26 and the output port 28 of FIG. 1. The output coaxial waveguide section 44 comprises an output inner conductor 48 and an output outer conductor 50 that are radially separated by a hollow opening 52. Outer surfaces of the output inner conductor 48 and inner surfaces of the output outer conductor 50 have gradually changed profiles configured to minimize an impedance mismatch from the output port 46 to the center waveguide section 16 (FIG. 1). The hollow opening 52 is cone shaped and is radially aligned with the output antenna structure 36 (FIG. 1) of each amplifier assembly 18 (FIG. 1) when assembled. The output port 46 may be mechanically attached to the output outer conductor 50 via one or more screws, bolts, or other mechanical fasteners (not shown). The output port 46 may also be mechanically attached to the output inner conductor 48. In FIG. 2, a slip fit pin 54 and a socket 56 mechanically attach the output port 46 to the output inner conductor 48. As illustrated, the output port 46 includes a rectangular waveguide opening 58 with a stepped transformer 60. In operation, amplified output signals from the amplifier assemblies 18 (FIG. 1) are spatially segregated in an expanded or oversized coaxial arrangement. The amplified output signals are radially received in the hollow opening 52. The amplified output signals radiate between the output inner conductor 48 and the output outer conductor 50 as they propagate toward the output port 46 along the tapered hollow opening 52. The amplified output signals then radiate between the slip fit pin 54 and a socket 56 connection and the output outer conductor 50 as they propagate into the waveguide opening 58 of the output port 46. As illustrated, the amplified output signals are funneled through a narrow opening 62 that is formed between the slip fit pin 54 and the socket 56 connection and the output outer conductor 50.

As the amplified output signals converge to form a combined output signal, an interface between the output coaxial waveguide 44 and the output port 46 and in particular, the narrow opening 62 experiences the highest amount of operating power. Accordingly, this interface has power handling limitations. For example, if the operating power becomes too large, various failure mechanisms may be introduced. In one potential failure mode, a high output power can produce thermal failures of the slip fit pin 54 and the socket 56 connection. The small size of the slip fit pin 54 and the socket 56 connection combined with high heat generated from the high output power can lead to melting or other loss of contact between the slip fit pin 54 and the socket 56 connection. In another potential failure mode, arcing may occur at higher output powers between the pin 54 and the socket 56 connection and the output outer conductor 50 due to their close proximity to each other. Additionally, arcing problems are exacerbated in low air pressure environments, such as high altitudes.

Figure 3:
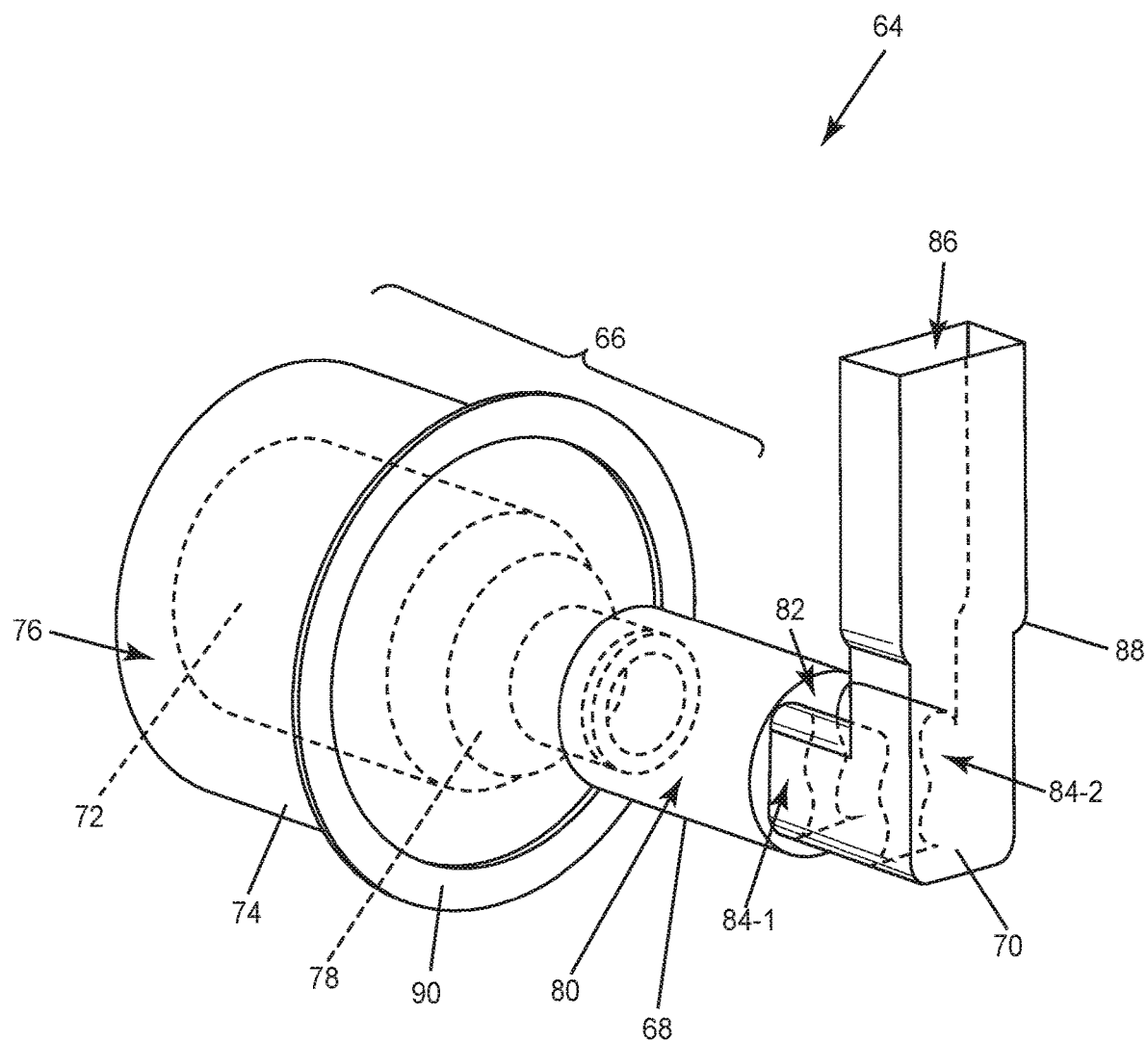
FIG. 3 is a perspective view of a model of a waveguide transition device according to embodiments disclosed herein.

FIG. 3 is a perspective view of a model of a waveguide transition device 64 according to embodiments disclosed herein. The waveguide transition device 64 is configured to transition radio frequency (RF) energy, such as the amplified output signals of the amplifier assemblies 18 of FIG. 1, from an oversized coaxial configuration to a waveguide mode in a more direct manner. The waveguide transition device 64 includes a coaxial waveguide section 66, a waveguide coupling section 68, and a waveguide output port 70. The coaxial waveguide section 66 includes an inner conductor 72 and an outer conductor 74 that are radially separated by a first hollow opening 76. The inner conductor 72 further includes a nozzle component 78 that tapers and narrows the overall diameter of the inner conductor 72 in a direction toward the waveguide coupling section 68. In some embodiments, the nozzle component 78 is a separate component that is attached to the inner conductor 72, while in other embodiments, the nozzle component 78 is an integral single component with the inner conductor 72. In a similar manner, the outer conductor 74 tapers and narrows around the nozzle component 78 such that the first hollow opening 76 becomes cone-shaped in a direction toward the waveguide coupling section 68. The waveguide coupling section 68 includes a second hollow opening 80 that is cylindrical, and the second hollow opening 80 does not include an inner conductor. In that regard, the configuration of the inner conductor 72 and the outer conductor 74 ends at the waveguide coupling section 68. In some embodiments, the waveguide coupling section 68 may be continuous with the outer conductor 74. At the interface between the waveguide coupling section 68 and the waveguide output port 70, a septum 82 forms at least two hollow channels 84-1, 84-2 in a portion of the waveguide output port 70. The at least two hollow channels 84-1, 84-2 may comprise kidney shaped channels. The at least two hollow channels 84-1, 84-2 lead to a third hollow opening 86 of the waveguide output port 70. In some embodiments, the third hollow opening 86 is a rectangular opening and is configured at a right angle to the at least two hollow channels 84-1, 84-2. The third hollow opening 86 may also include one or more steps 88 that increase or decrease the overall size of the third hollow opening 86 to form a desired type of a waveguide, such as a WR28 rectangular waveguide. The third hollow opening 86 may not include an inner conductor; in some embodiments, the waveguide output port 70 is continuous with the waveguide coupling section 68 and the outer conductor 74 of the coaxial waveguide section 66. In FIG. 3, a gasket 90 is illustrated around the outer conductor 74. In some embodiments, the gasket 90 is configured to assist alignment with portions of the center waveguide 16, such as possible lateral extensions or protrusions of the body 20 of each amplifier assembly 18 of FIG. 1.

In operation, RF energy, such as amplified output signals from the amplifier assemblies 18 of FIG. 1, radiate between the inner conductor 72 and the outer conductor 74 in the first hollow opening 76. The RF energy then converges through the tapering of the first hollow opening 76 around the nozzle component 78 to combine and propagate inside the second hollow opening 80 of the waveguide coupling section 68. The RF energy then radiates around the septum 82 and through the at least two hollow channels 84-1, 84-2 before it finally combines and propagates through the third hollow opening 86 of the waveguide output port 70. In this manner, the RF energy transitions from multiple waveguide modes within the waveguide transition device 64. For example, in some embodiments, RF energy coaxially enters the first hollow opening 76 in a transverse electromagnetic mode (TEM) mode. The RF energy is then transitioned to a transverse magnetic mode $TM_{01}$ by the tapering around the nozzle component 78 and propagates through the cylindrical second hollow opening 80. Finally, as the RF energy propagates through the at least two hollow channels 84-1, 84-2, an RF potential is created that allows the RF energy to transition to a transverse electric mode $TE_{10}$ as it propagates through the third hollow opening 86. In this manner, RF energy is transitioned in a more direct manner than previously described for the example of FIG. 2, thereby eliminating the need for the slip fit pin 54 and the socket 56 connection as well as the various failure modes associated with it.

Figure 4:
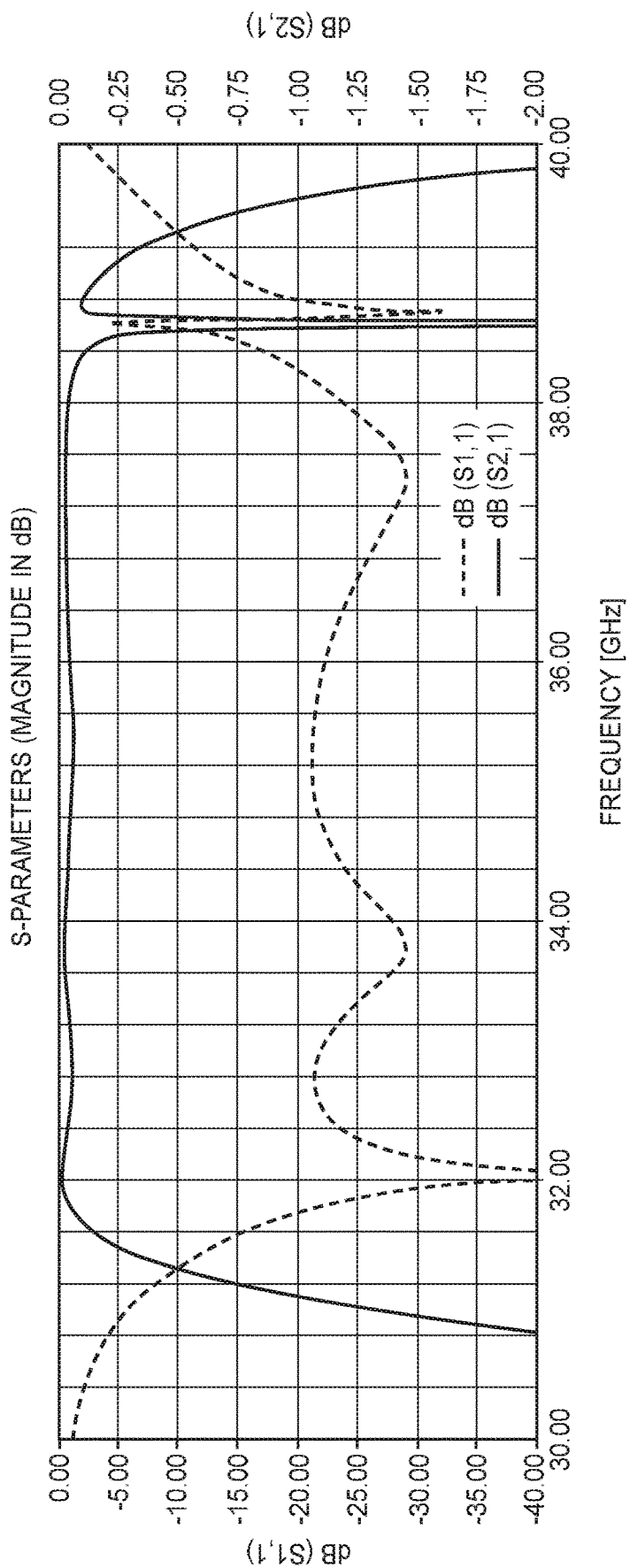
FIG. 4 is an S-parameters plot for a model of the waveguide transition device of FIG. 3 that is configured to operate across a frequency band of 32-38 GHz.

FIG. 4 is an S-parameters plot for a model of the waveguide transition device 64 of FIG. 3 that is configured to operate across a frequency band of 32-38 GHz. The S-parameter magnitude is plotted in decibels (dB) across a GHz frequency range. Return loss, or S1,1, is an indication of how much power is reflected. For frequencies where S1,1 is equal to 0 dB, then substantially all power from a signal is reflected. A return loss of at least −10 dB or lower is desirable for a target operating frequency range. Insertion loss, or S2,1, is an indication of how much power is transferred. For frequencies where S2,1 is equal to 0 dB, then substantially all power from a signal is transferred. Accordingly, the model of the waveguide transition device 64 demonstrates good power transfer across an operating bandwidth of at least 32 GHz to 38 GHz.

Figure 5:
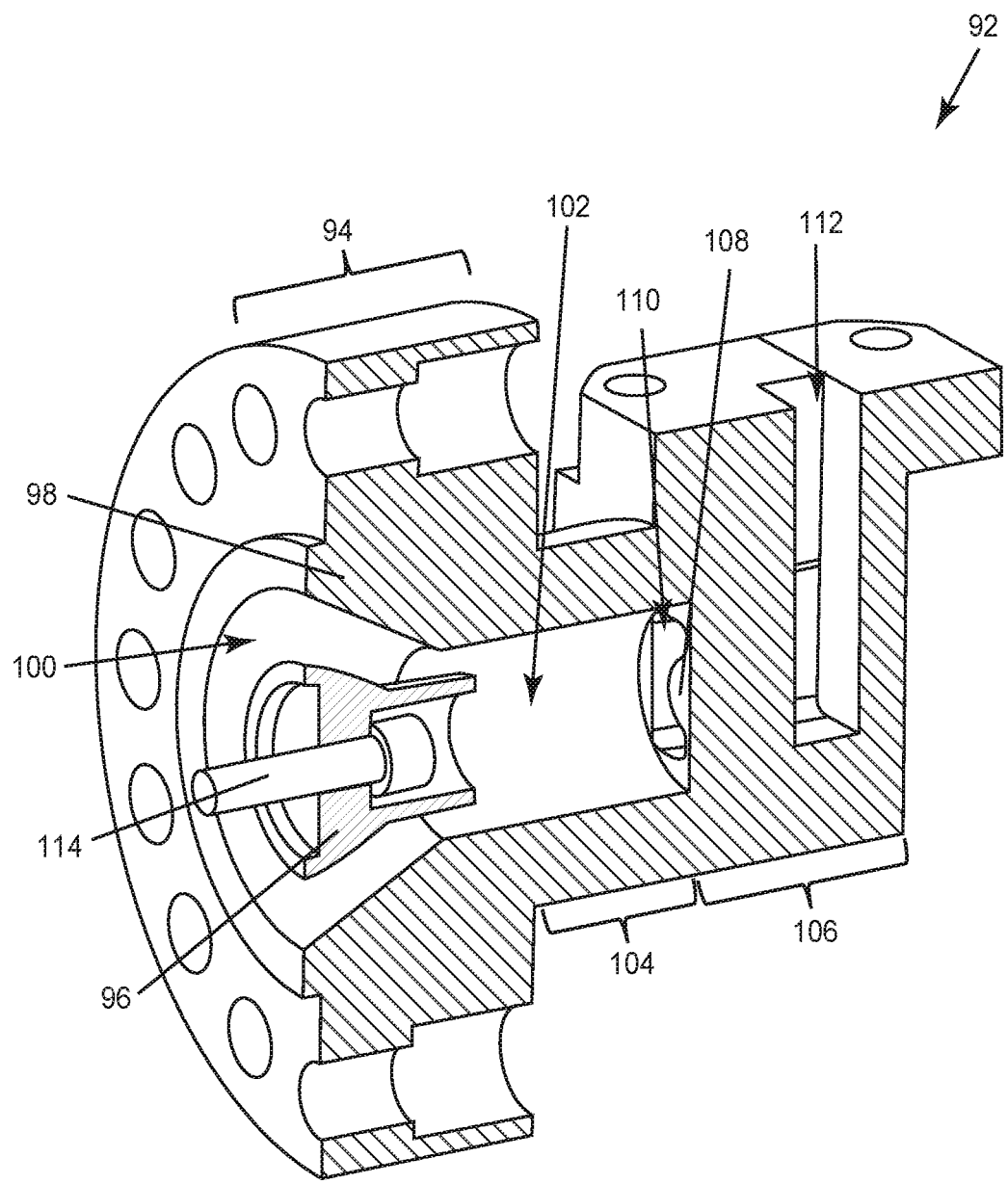
FIG. 5 is a cross-sectional perspective view of a representative waveguide transition device according to embodiments disclosed herein.

FIG. 5 is a cross-sectional perspective view of a representative waveguide transition device 92 according to embodiments disclosed herein. The waveguide transition device 92 is similar to the model of the waveguide transition device 64 of FIG. 3. A coaxial waveguide section 94 includes an inner conductor 96 and an outer conductor 98. The inner conductor 96 and the outer conductor 98 are radially separated by a first hollow opening 100. In some embodiments, the first hollow opening 100 is a cone-shaped hollow opening that tapers toward a second hollow opening 102. A waveguide coupling section 104 includes the second hollow opening 102; in some embodiments, the second hollow opening 102 is a cylindrical hollow opening that is coupled to the cone-shaped first hollow opening 100. Stated differently, the second hollow opening 102 is registered with the first hollow opening 100 and the inner conductor 96. In some embodiments, the waveguide coupling section 104 is devoid of an inner conductor 96. The waveguide transition device 92 further includes a waveguide output port 106 that is coupled to the waveguide coupling section 104. In this manner, the waveguide coupling section 102 is between the coaxial waveguide section 94 and the waveguide output port 106. As illustrated in FIG. 5, the outer conductor 98, the waveguide coupling section 104, and the waveguide output port 106 are an integral single component. Stated differently, a same material is continuous between the outer conductor 98, the waveguide coupling section 104, and the waveguide output port 106. In some embodiments, the same material comprises aluminum or alloys thereof or copper or alloys thereof. In alternative embodiments, the outer conductor 98, the waveguide coupling section 104, and the waveguide output port 106 include separate components that are joined together. A septum 108 is arranged between the waveguide coupling section 104 and the waveguide output port 106. The septum 108 forms at least two hollow channels 110 (only one is visible in the cross-sectional view) that connect between the waveguide coupling section 104 and the waveguide output port 106. The waveguide output port 106 includes a third hollow opening 112 that is configured as a rectangular waveguide. As will be described in more detail below, the inner conductor 96 includes a mechanical fastener 114 for attaching and mechanically supporting the inner conductor 96 to a component outside of the waveguide transition device 92.

Figure 6:
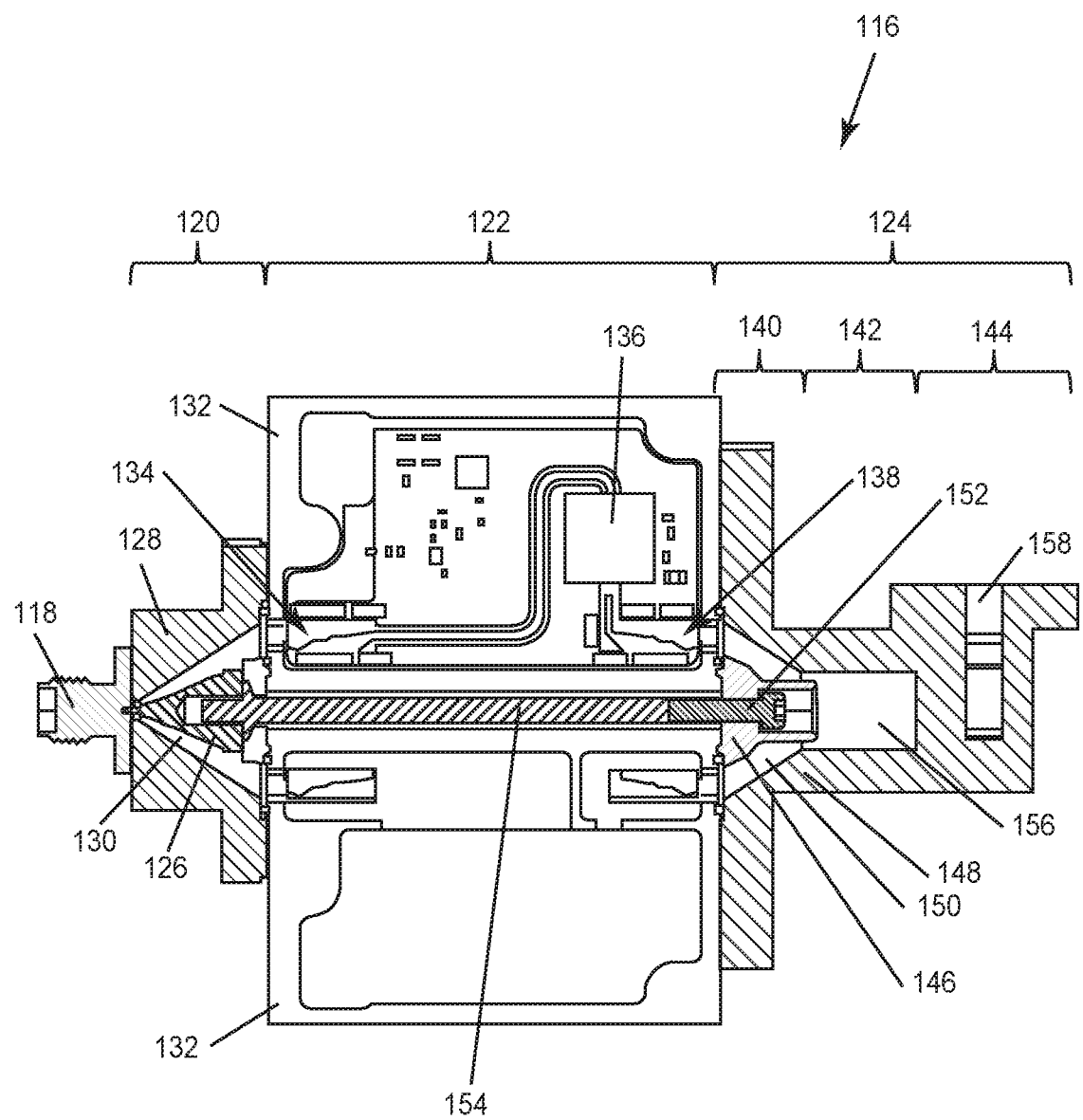
FIG. 6 is a cross-sectional view of a spatial power-combining device according to embodiments disclosed herein.

FIG. 6 is a cross-sectional view of a spatial power-combining device 116 according to embodiments disclosed herein. The spatial power-combining device includes an input port 118, an input coaxial waveguide section 120, a center waveguide section 122, and a waveguide transition device 124, as previously described. The input coaxial waveguide section 120 includes an input inner conductor 126 and an input outer conductor 128 separated by an input coaxial opening 130 therebetween. The center waveguide section 120 includes a plurality of amplifier assemblies 132 that are arranged coaxially around a center axis as previously described. Each amplifier assembly 132 of the plurality of amplifier assemblies 132 includes an input antenna structure 134, an amplifier 136, and an output antenna structure 138. The input coaxial waveguide section 120 is configured to concurrently provide an RF signal to each amplifier assembly 132. The waveguide transition device 124 includes an output coaxial waveguide section 140, a waveguide coupling section 142, and a waveguide output port 144. The output coaxial waveguide section 140 includes an output inner conductor 146 and an output outer conductor 148 separated by an output coaxial opening 150 therebetween. In some embodiments, the output outer conductor 148, the waveguide coupling section 142, and the waveguide output port 144 are an integral single component. The output inner conductor 146 is mechanically attached to the center waveguide section 122. In FIG. 6, a mechanical fastener 152, such as a screw or bolt, mechanically attaches the output inner conductor 146 to a center rod 154 of the center waveguide section 122. The plurality of amplifier assemblies 132 are radially arranged around the center rod 154. In alternative embodiments, including those without a center rod 154, the output inner conductor 146 may be mechanically attached to the plurality of amplifier assemblies 132. The waveguide coupling section 142 includes a cylindrical waveguide opening 156 that is registered with the output coaxial opening 150 and the output inner conductor 146. The waveguide output port 144 includes a rectangular waveguide opening 158 that is connected to the cylindrical waveguide opening 156. In this manner, RF energy can propagate through the input port 118 and the input coaxial opening 130 and then be concurrently provided to each amplifier assembly 132 of the plurality of amplifier assemblies 132. After amplification, the RF energy is concurrently combined as it propagates through the output coaxial opening 150 and through the cylindrical waveguide opening 156 to the rectangular waveguide opening 158 as previously described. In this manner, the RF energy has a wider path to follow through the output coaxial waveguide section 140, the waveguide coupling section 142, and the waveguide output port 144 than in conventional designs. Accordingly, failure mechanisms such as thermal failure and arcing are suppressed at higher output powers and the spatial power-combining device 116 has improved power handling capabilities.

In addition to spatial power-combining devices, other types of structures for power-combining also have power handling limitations at or near transitions to an output port. One such structure is a radial power-combiner that generally includes radiative or conductive feed networks for amplified signals arranged around a radial hub. The feed networks converge into a small-sized coaxial section that transitions the combined amplified signals to a waveguide output port or interface. In a similar manner to the narrow opening 62 of FIG. 2, the coaxial section is a narrow region that experiences the highest amount of operating power. Failure modes include thermal breakdown of a dielectric material that separates inner and outer conductors of the coaxial section as well as voltage breakdown in areas where there are gaps in the dielectric material. As previously described, voltage breakdown or arcing is exacerbated in low air pressure environments, such as high altitudes. For example, a simulation was performed for a model radial power-combiner that includes a coaxial section with a Teflon sleeve for the dielectric material. The simulated operating conditions included 200 watts (W) of RF load at 35 GHz. In the model, a 118° C. temperature rise was predicted for the Teflon sleeve. The model radial combiner demonstrated a power handling capability of 200 W at sea level, but the power handling capability decreased to 90 W at an altitude of 30,000 feet; to 40 W at an altitude of 50,000 feet; and to 35 W at critical pressure due to increased voltage breakdown.

Figure 7:
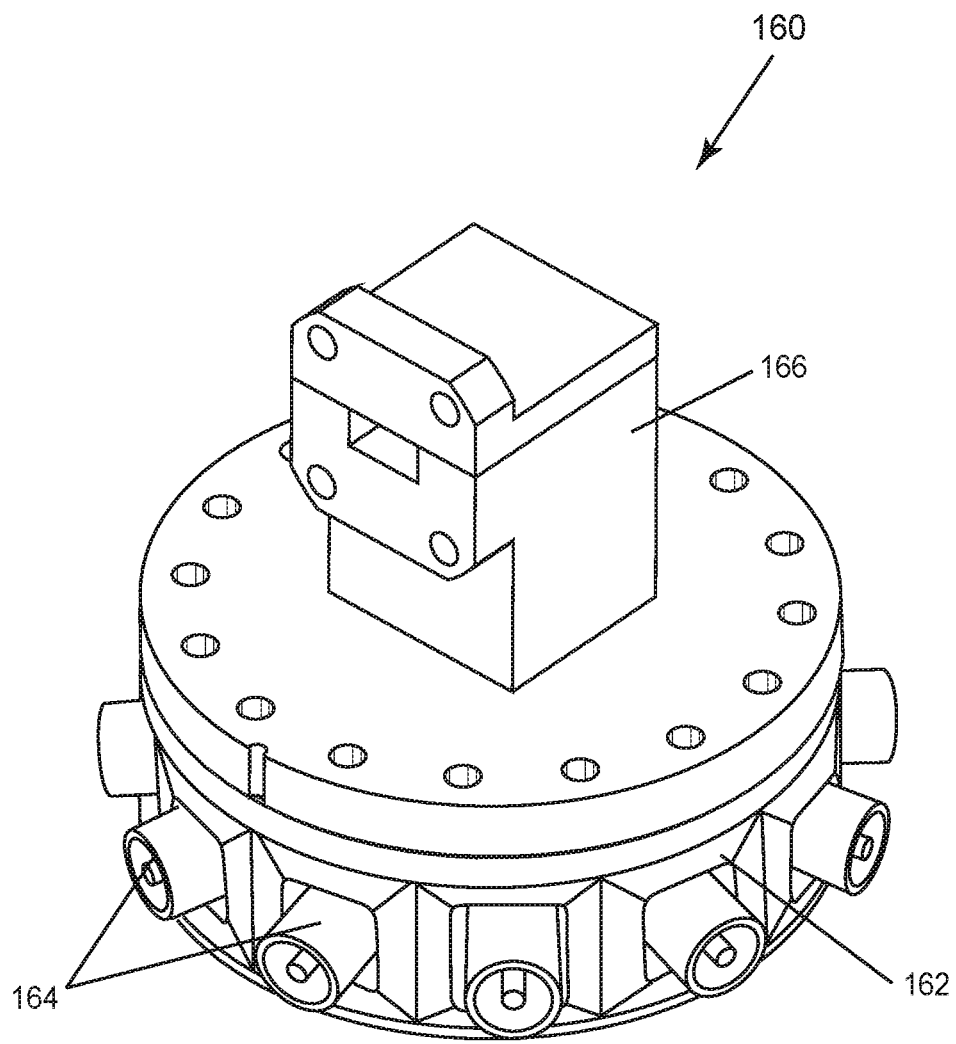
FIG. 7 is a perspective view of a representative radial power-combining device according to embodiments disclosed herein.

FIG. 7 is a perspective view of a representative radial power-combining device 160 according to embodiments disclosed herein. The radial power-combining device 160 includes a radial or cylindrical hub 162. The hub 162 includes a plurality of ports 164 configured to receive RF signals from a plurality of sources. The radial power-combining device 160 further includes a waveguide transition device 166 that is similar to the previously described waveguide transition device 92 of FIG. 5. The waveguide transition device 166 is thereby configured to receive signals from the plurality of ports 164 and combine and transition the signals to a waveguide output. In this manner, the small-sized coaxial section and dielectric material of conventional radial power-combining devices is eliminated, allowing the RF signals to pass and transition through larger openings within the radial power-combining device 160. Accordingly, the radial power-combining device 160 has increased power handling capabilities. Simulations were run for a model radial power-combiner similar to the radial power combining device 160 of FIG. 7. Without the conventional small-sized coaxial section and dielectric material, the model results provided significantly higher power handling capability, including greater than 2 kilowatts (kW) at sea level; 670 W at an altitude of 30,000 feet; 170 W at an altitude of 50,000 feet; and 90 W at critical pressure.

Those skilled in the art will recognize improvements and modifications to the preferred embodiments of the present disclosure. All such improvements and modifications are considered within the scope of the concepts disclosed herein and the claims that follow.

What is claimed is:

1. A waveguide transition device comprising:
a coaxial waveguide section comprising an inner conductor and an outer conductor;
a waveguide output port; and
a waveguide coupling section between the coaxial waveguide section and the waveguide output port, the waveguide coupling section comprising a cylindrical hollow opening that is devoid of the inner conductor;
wherein the outer conductor, the waveguide coupling section, and the waveguide output port are an integral single component.

2. The waveguide transition device of claim 1 wherein the inner conductor and the outer conductor are radially separated by a cone-shaped hollow opening.

3. The waveguide transition device of claim 2 wherein the cylindrical hollow opening is coupled to the cone-shaped hollow opening.

4. The waveguide transition device of claim 3 wherein the waveguide coupling section is devoid of any inner conductor.

5. The waveguide transition device of claim 1 further comprising a septum between the waveguide coupling section and the waveguide output port.

6. The waveguide transition device of claim 5 wherein the septum forms at least two hollow channels that connect between the waveguide coupling section and the waveguide output port.

7. The waveguide transition device of claim 1 wherein the waveguide output port comprises a rectangular waveguide.

8. A spatial power-combining device comprising the waveguide transition device of claim 1.

9. A radial power-combining device comprising the waveguide transition device of claim 1.

10. A waveguide transition device comprising:
a coaxial waveguide section comprising an inner conductor and an outer conductor that are radially separated by a first hollow opening;
a waveguide coupling section comprising a second hollow opening that is registered with the first hollow opening and the inner conductor, wherein the first hollow opening tapers in a direction toward the waveguide coupling section; and
a waveguide output port coupled to the waveguide coupling section.

11. The waveguide transition device of claim 10 wherein the first hollow opening comprises a cone-shaped opening and the second hollow opening comprises a cylindrical opening.

12. The waveguide transition device of claim 10 further comprising a septum between the waveguide coupling section and the waveguide output port.

13. The waveguide transition device of claim 12 wherein the septum forms at least two hollow channels that connect between the waveguide coupling section and the waveguide output port.

14. The waveguide transition device of claim 10 wherein the waveguide output port comprises a rectangular waveguide.

15. A spatial power-combining device comprising:
a plurality of amplifier assemblies, wherein each amplifier assembly of the plurality of amplifier assemblies comprises:
an amplifier;
an input antenna structure; and
an output antenna structure;
an output coaxial waveguide section comprising an output inner conductor and an output outer conductor;
a waveguide output port; and
a waveguide coupling section between the output coaxial waveguide section and the waveguide output port;
wherein the output outer conductor, the waveguide coupling section, and the waveguide output port are an integral single component.

16. The spatial power-combining device of claim 15 wherein the output coaxial waveguide section comprises an output coaxial opening and the waveguide coupling section comprises a cylindrical waveguide opening.

17. The spatial power-combining device of claim 16 wherein the cylindrical waveguide opening is registered with the output coaxial opening and the output inner conductor.

18. The spatial power-combining device of claim 16 wherein the waveguide output port comprises a rectangular waveguide opening that is connected to the cylindrical waveguide opening.

19. The spatial power-combining device of claim 15 wherein the plurality of amplifier assemblies are radially arranged around a center rod and the output inner conductor is mechanically attached to the center rod.

20. The spatial power-combining device of claim 15 wherein the output inner conductor is mechanically attached to the plurality of amplifier assemblies.

* * * * *